United States Patent
Choi et al.

(10) Patent No.: US 12,408,553 B2
(45) Date of Patent: Sep. 2, 2025

(54) THERMOELECTRIC ELEMENT

(71) Applicant: LG INNOTEK CO., LTD., Seoul (KR)

(72) Inventors: Man Hue Choi, Seoul (KR); Se Woon Lee, Seoul (KR); Jong Min Lee, Seoul (KR); Hyung Eui Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/577,744

(22) PCT Filed: Jul. 12, 2022

(86) PCT No.: PCT/KR2022/010134
§ 371 (c)(1),
(2) Date: Jan. 9, 2024

(87) PCT Pub. No.: WO2023/287167
PCT Pub. Date: Jan. 19, 2023

(65) Prior Publication Data
US 2024/0180036 A1 May 30, 2024

(30) Foreign Application Priority Data
Jul. 12, 2021 (KR) ........................ 10-2021-0090956

(51) Int. Cl.
*H10N 10/817* (2023.01)
*H10N 10/17* (2023.01)

(52) U.S. Cl.
CPC ........... *H10N 10/817* (2023.02); *H10N 10/17* (2023.02)

(58) Field of Classification Search
CPC ....... H10N 10/17; H10N 10/81; H10N 10/817
See application file for complete search history.

(56) References Cited

U.S. PATENT DOCUMENTS

| 2001/0001961 A1* | 5/2001 | Hiraishi | H10N 10/17 136/201 |
| 2005/0016183 A1* | 1/2005 | Tateyama | H10N 10/01 136/204 |

(Continued)

FOREIGN PATENT DOCUMENTS

| JP | 09-055541 | 2/1997 |
| JP | 2015-177047 | 10/2015 |

(Continued)

OTHER PUBLICATIONS

KR 10-2275612 B1 English Translation, as provided by FIT database, translated on Jan. 18, 2025.*

(Continued)

*Primary Examiner* — Golam Mowla
(74) *Attorney, Agent, or Firm* — KED & ASSOCIATES, LLP

(57) ABSTRACT

A thermoelectric element according to an embodiment of the present invention comprises: a first substrate; an insulation layer disposed on the first substrate; a first electrode disposed on the insulation layer; a bonding layer disposed on the first electrode; a semiconductor structure disposed on the bonding layer; a second electrode disposed on the semiconductor structure; and a second substrate disposed on the second electrode, wherein the upper surface of the insulation layer includes a first concave surface vertically overlapping the first electrode, the bonding layer includes a first area vertically overlapping the first concave surface and the semiconductor structure and a second area which vertically overlaps the first concave surface and does not vertically overlap the semiconductor structure, and a void density of the first area is smaller than that of the second area.

20 Claims, 14 Drawing Sheets

(56) References Cited

U.S. PATENT DOCUMENTS

| | | | | |
|---|---|---|---|---|
| 2007/0044828 A1* | 3/2007 | Iwanade | ................ | H10N 10/17 |
| | | | | 136/230 |
| 2009/0225556 A1* | 9/2009 | Hsu | ........................ | F21V 29/54 |
| | | | | 362/373 |
| 2015/0179912 A1* | 6/2015 | Maeshima | ............. | H10N 10/17 |
| | | | | 136/211 |
| 2017/0194549 A1* | 7/2017 | Mascolo | ................ | H10N 10/01 |

FOREIGN PATENT DOCUMENTS

| KR | 10-2020-0130806 | 11/2020 |
|---|---|---|
| KR | 10-2021-0062987 | 6/2021 |
| KR | 10-2275612 | 7/2021 |

OTHER PUBLICATIONS

JP 2015-177047 A English Translation, as provided by FIT database, translated on Jan. 18, 2025.*
International Search Report dated Oct. 7, 2022 issued in Application No. PCT/KR2022/010134.

* cited by examiner

FIG. 9
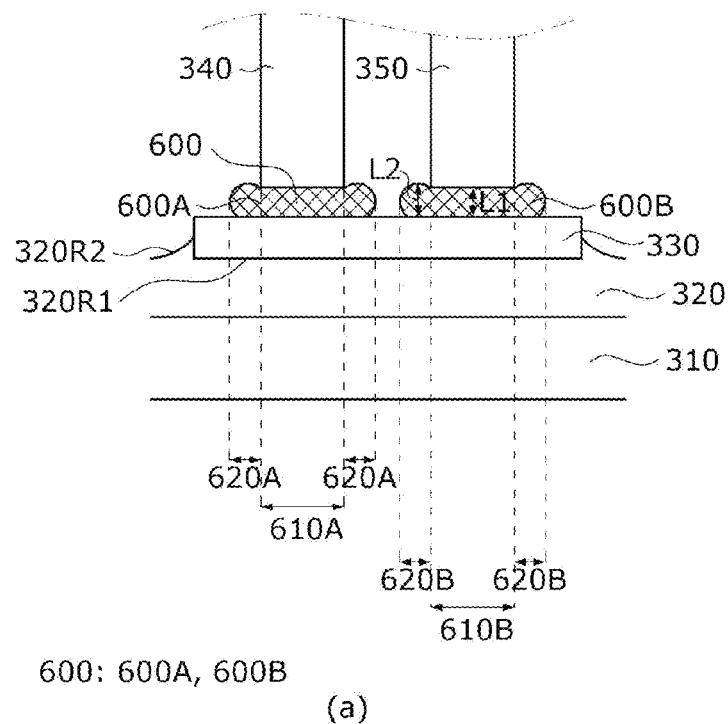
(a)
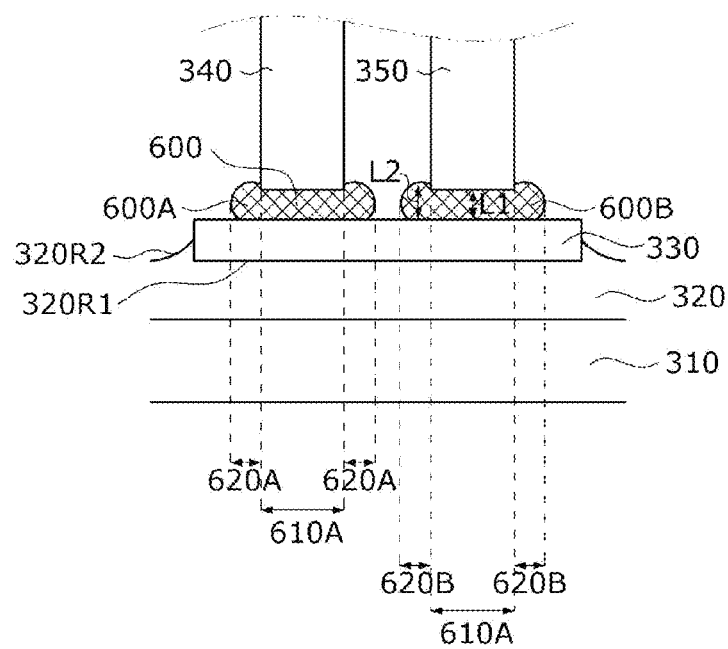
(b)

600: 600A, 600B

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2022/010134, filed Jul. 12, 2022, which claims priority to Korean Patent Application No. 10-2021-0090956, filed Jul. 12, 2021, whose entire disclosures are hereby incorporated by reference.

TECHNICAL FIELD

The present invention relates to a thermoelectric element.

BACKGROUND ART

A thermoelectric phenomenon is a phenomenon caused by the movement of electrons and holes inside a material and means direct energy conversion between heat and electricity.

A thermoelectric element is a general term for an element using the thermoelectric phenomenon and has a structure in which a P-type thermoelectric material and an N-type thermoelectric material are bonded between metal electrodes to form a PN junction pair.

Thermoelectric elements may be classified into elements using a temperature change in electrical resistance, elements using the Seebeck effect, which is a phenomenon in which an electromotive force is generated due to a temperature difference, elements using the Peltier effect which is a phenomenon in which heat absorption or heat generation occurs due to a current, and the like.

Thermoelectric elements are widely applied to home appliances, electronic components, communication components, and the like. For example, the thermoelectric elements may be applied to cooling devices, heating devices, power generation devices, and the like. Therefore, the demand for the thermoelectric performance of the thermoelectric element is gradually increasing.

The thermoelectric element includes substrates, electrodes, and thermoelectric legs, in which a plurality of thermoelectric legs are disposed in the form of an array between an upper substrate and a lower substrate, a plurality of upper electrodes are disposed between the plurality of thermoelectric legs and the upper substrate, and a plurality of lower electrodes are disposed between the plurality of thermoelectric legs and the lower substrate.

In a manufacturing process of the thermoelectric element, bonding between the substrates, the electrodes, and the thermoelectric legs may be processed in a high temperature environment. Generally, an electrode and a thermoelectric leg may be bonded through a reflow process in which the thermoelectric leg is disposed on the electrode coated with a solder layer and then processed at a high temperature. Many voids may be present in the solder layer passing through the reflow process. FIG. 1 is a photograph illustrating voids that are present in the solder layer after reflow. Referring to FIG. 1, it can be seen that many voids are present in an area disposed between an electrode and a thermoelectric leg. Due to these voids, a bonding strength, thermal conductivity, and electrical conductivity between the electrode and the thermoelectric leg can be lowered, and as a result, the reliability of the thermoelectric element can be lowered.

In addition, when the electrode is coated with an excessive amount of solder layer, the thermoelectric leg may slip or twist on the molten solder layer during the reflow process. Therefore, a problem in which the thermoelectric leg and the electrode cannot be closely bonded, or a short circuit may occur between a pair of thermoelectric legs may occur.

DISCLOSURE

Technical Problem

The present invention is directed to providing a thermoelectric element with excellent reliability.

The present invention is also directed to increasing a bonding strength between an electrode and a thermoelectric leg.

Technical Solution

A thermoelectric element according to one embodiment of the present invention includes a first substrate, an insulating layer disposed on the first substrate, a first electrode disposed on the insulating layer, a bonding layer disposed on the first electrode, a semiconductor structure disposed on the bonding layer, a second electrode disposed on the semiconductor structure, and a second substrate formed on the second electrode, wherein an upper surface of the insulating layer includes a first concave surface vertically overlapping the first electrode, the bonding layer includes a first area vertically overlapping the first concave surface and the semiconductor structure, and a second area vertically overlapping the first concave surface and not vertically overlapping the semiconductor structure, and a void density of the first area is smaller than a void density of the second area.

The second area may be disposed to surround the first area.

A maximum thickness of the second area may be greater than a maximum thickness of the first area.

At least a portion of the second area may be disposed on a side surface of the semiconductor structure.

The upper surface of the insulating layer may further include a second concave surface not vertically overlapping the first electrode, and the bonding layer may further include a third area vertically overlapping the second concave surface at a side surface of the first electrode.

The third area may not come into contact with the second concave surface.

The bonding layer may include solder.

An area of the bonding layer may be 1.4 times or less an area of the semiconductor structure.

The semiconductor structure may include a first semiconductor element and a second semiconductor element disposed to be spaced apart from each other on the first electrode, the bonding layer may include a first bonding layer disposed between the first electrode and the first semiconductor element, and a second bonding layer disposed between the first electrode and the second semiconductor element, and the first bonding layer and the second bonding layer may each include areas not vertically overlapping the first semiconductor element and the second semiconductor element.

The first bonding layer and the second bonding layer may be disposed to be spaced apart from each other on the first electrode.

The first bonding layer and the second bonding layer may be connected on the first electrode between the first semiconductor element and the semiconductor element.

The thermoelectric element may further include a first plating layer disposed between the first electrode and the first bonding layer, and a second plating layer disposed between the first electrode and the second bonding layer, wherein an area of each of the first plating layer and the second plating layer may be greater than or equal to an area of a surface, which is disposed to face the first electrode, of each of the first semiconductor element and the second semiconductor element, and a sum of the area of the first plating layer and the area of the second plating layer may be smaller than an area of the first electrode.

The insulating layer may include a first insulating layer disposed on the first substrate, and a second insulating layer disposed on the first insulating layer, and the first concave surface and the second concave surface may be included in the second insulating layer.

Advantageous Effects

According to embodiments of the present invention, it is possible to obtain a thermoelectric element with excellent thermal conductivity and bonding performance and high reliability. In addition, according to the embodiments of the present invention, it is possible to obtain a thermoelectric element that satisfies all performance differences required between a low-temperature part and a high-temperature part.

The thermoelectric element according to the embodiments of the present invention can be applied to not only small-scale applications but also large-scale applications such as vehicles, ships, steel mills, and incinerators.

DESCRIPTION OF DRAWINGS

FIG. 9 (a) to 11 are cross-sectional views of a portion of a thermoelectric element according to another embodiment of the present invention.

MODES OF THE INVENTION

Hereinafter, exemplary embodiments according to the present invention will be described in detail with reference to the accompanying drawings.

However, the technical spirit of the present invention is not limited to some of the described embodiments, but may be implemented in various different forms, and one or more of the components among the embodiments may be used by being selectively coupled or substituted without departing from the scope of the technical spirit of the present invention.

In addition, terms (including technical and scientific terms) used in embodiments of the present invention may be construed as meaning that may be generally understood by those skilled in the art to which the present invention pertains unless explicitly specifically defined and described, and the meanings of the commonly used terms, such as terms defined in a dictionary, may be construed in consideration of contextual meanings of related technologies.

In addition, the terms used in the embodiments of the present invention are for describing the embodiments and are not intended to limit the present invention.

In the specification, a singular form may include a plural form unless otherwise specified in the phrase, and when described as "at least one (or one or more) of A, B, and C," one or more among all possible combinations of A, B, and C may be included.

In addition, terms such as first, second, A, B, (a), and (b) may be used to describe components of the embodiments of the present disclosure.

These terms are only for the purpose of distinguishing one component from another component, and the nature, sequence, order, or the like of the corresponding components is not limited by these terms.

In addition, when a first component is described as being "connected," "coupled," or "joined" to a second component, it may include a case in which the first component is directly connected, coupled, or joined to the second component, but also a case in which the first component is "connected," "coupled," or "joined" to the second component by other components present between the first component and the second component.

In addition, when a certain component is described as being formed or disposed on "on (above)" or "below (under)" another component, the terms "on (above)" or "below (under)" may include not only a case in which two components are in direct contact with each other, but also a case in which one or more other components are formed or disposed between the two components. In addition, when described as "on (above) or below (under)," it may include the meaning of not only an upward direction but also a downward direction based on one component.

Figure 1:
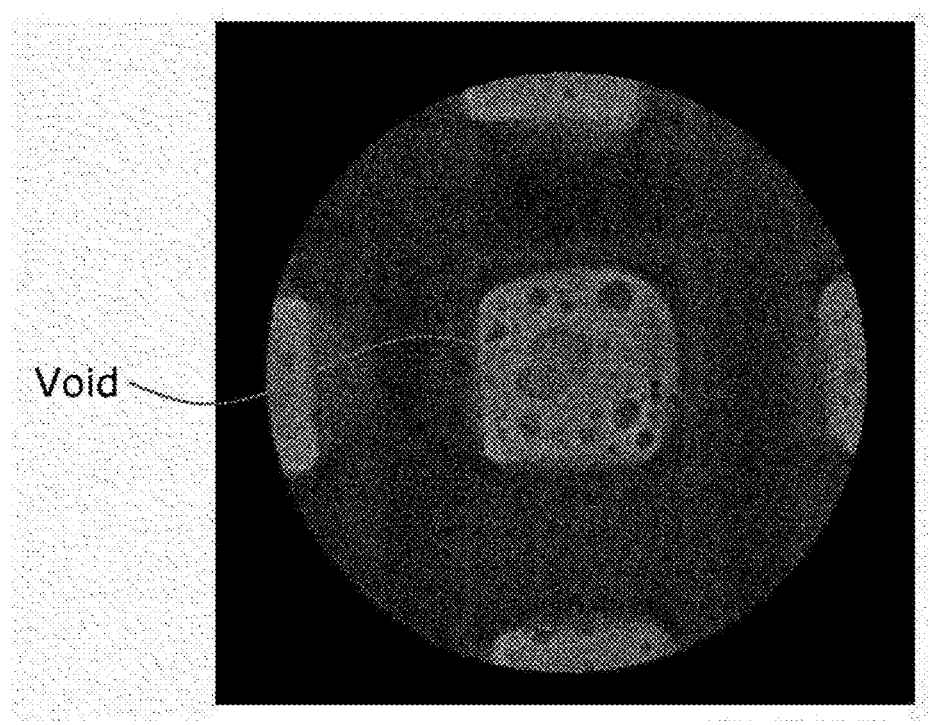
FIG. 1 is a photograph illustrating voids that are present in a solder layer after reflow.
Figure 2:
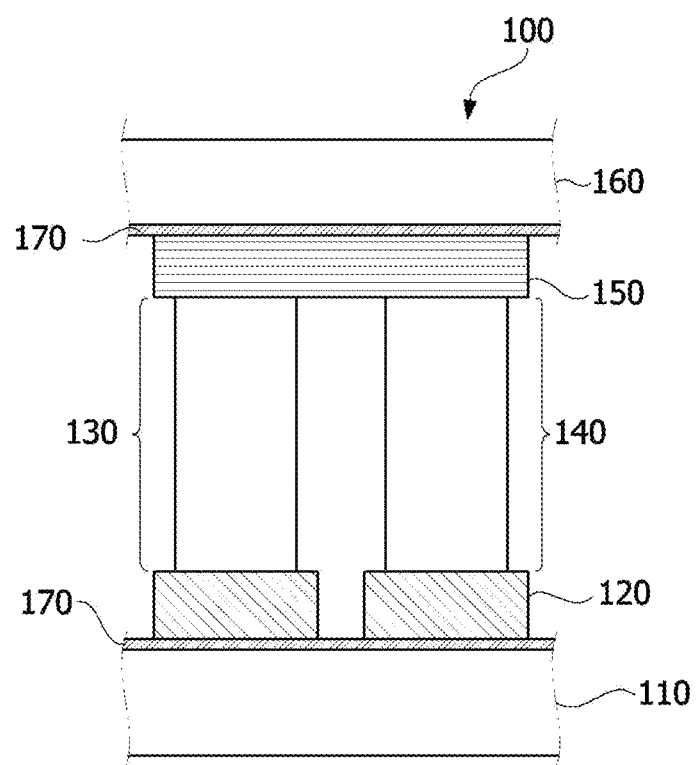
FIG. 2 is a cross-sectional view of a thermoelectric element.
Figure 3:
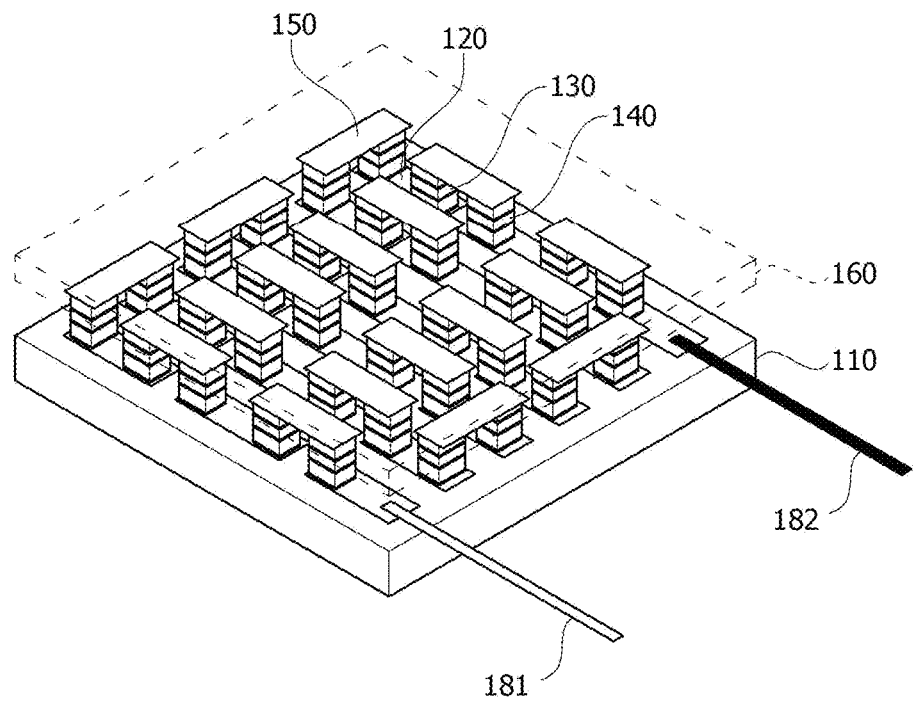
FIG. 3 is a perspective view of the thermoelectric element.
Figure 4:
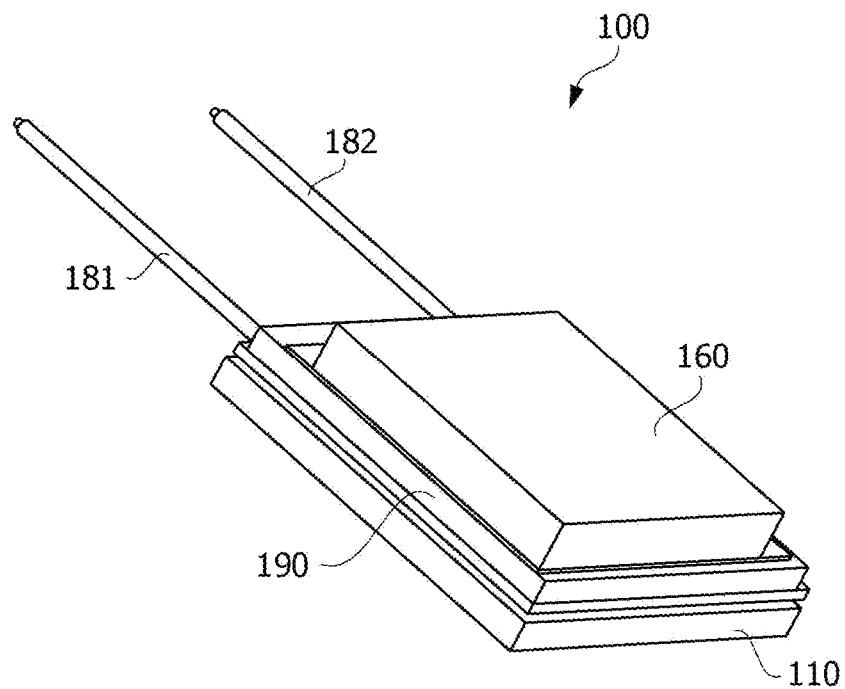
FIG. 4 is a perspective view of the thermoelectric element including a sealing member.
Figure 5:
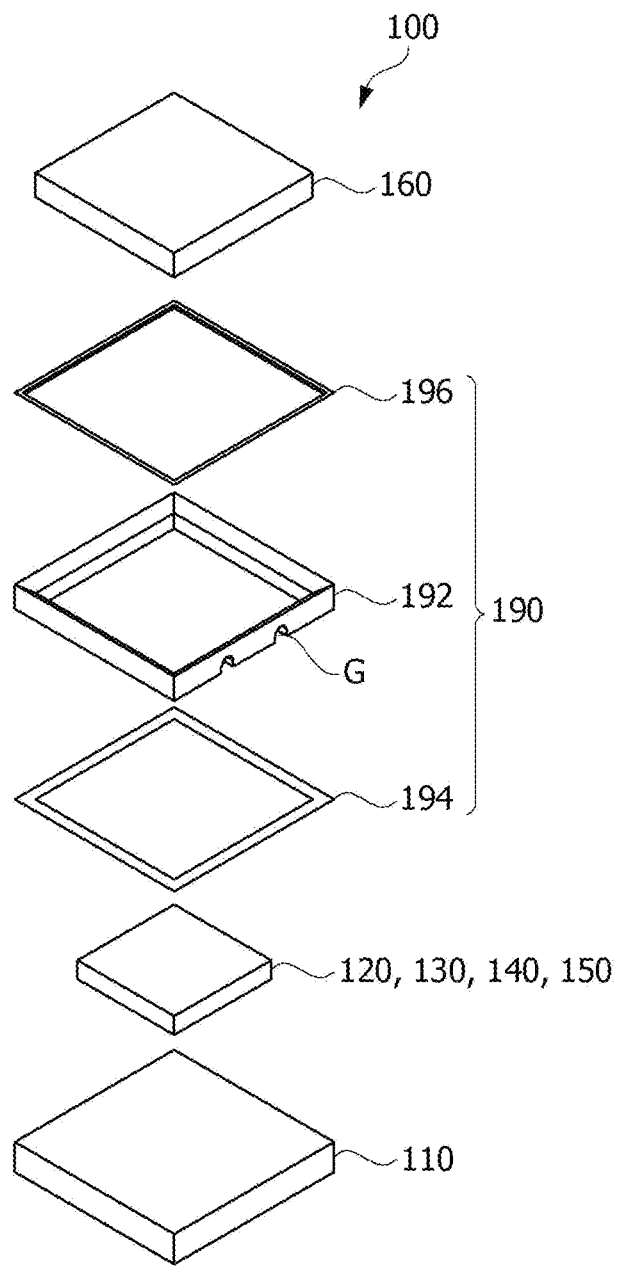
FIG. 5 is an exploded perspective view of the thermoelectric element including the sealing member.

FIG. 2 is a cross-sectional view of a thermoelectric element, and FIG. 3 is a perspective view of the thermoelectric element. FIG. 4 is a perspective view of the thermoelectric element including a sealing member, and FIG. 5 is an exploded perspective view of the thermoelectric element including the sealing member.

Referring to FIGS. 2 and 3, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Therefore, the plurality of P-type thermoelectric legs 130 and the plurality of N-type thermoelectric legs 140 are electrically connected by the upper electrodes 120 and the lower electrodes 150. A pair of P-type thermoelectric legs 130 and N-type thermoelectric legs 140 which are disposed between the lower electrode 120 and the upper electrode 150 and electrically connected may form a unit cell.

For example, when a voltage is applied to the lower electrode 120 and the upper electrode 150 through lead wires 181 and 182, due to the Peltier effect, a substrate in which a current flows from the P-type thermoelectric leg 130 to the N-type thermoelectric leg 140 may absorb heat to function as a cooling part, and a substrate in which a current flows from the N-type thermoelectric leg 140 to the P-type thermoelectric leg 130 may be heated to function as a heating part. Alternatively, when a temperature difference between the lower electrode 120 and the upper electrode 150 is applied, charges in the P-type thermoelectric leg 130 and the N-type thermoelectric leg 140 may be moved due to the Seebeck effect to generate electricity.

In FIGS. 2 to 5, although it is illustrated that the lead wires 181 and 182 are disposed on the lower substrate 110, the present invention is not limited thereto, and the lead wires 181 and 182 may be disposed on the upper substrate 160, or one of the lead wires 181 and 182 may be disposed on the lower substrate 110, and the other thereof may be disposed on the upper substrate 160.

Here, the P-type thermoelectric leg 130 and the N-type thermoelectric leg 140 may be bismuth telluride (Bi—Te)-based thermoelectric legs containing bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Se—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %. Therefore, in the specification, the thermoelectric leg may be referred to as a semiconductor structure, a semiconductor element, a semiconductor material layer, a semiconductor material layer, a semiconductor material layer, a conductive semiconductor structure, a thermoelectric structure, a thermoelectric material layer, a thermoelectric material layer, a thermoelectric material layer, or the like.

The P-type thermoelectric leg 130 and the N-type thermoelectric leg 140 may be formed in a bulk type or stack type. In general, the bulk-type P-type thermoelectric leg 130 or the bulk-type N-type thermoelectric leg 140 may be obtained through a process of manufacturing an ingot through thermal treatment for a thermoelectric material, crushing and sieving the ingot to acquire powder for the thermoelectric leg, then sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack-type P-type thermoelectric leg 130 or the stack-type N-type thermoelectric leg 140 may be obtained through a process of coating a sheet-shaped base with a paste containing a thermoelectric material to form a unit member, and then stacking and cutting the unit members.

In this case, the pair of P-type thermoelectric legs 130 and N-type thermoelectric legs 140 may have the same shape and volume or have different shapes and volumes. For example, since the electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, or the like.

Alternatively, the P-type thermoelectric leg 130 or the N-type thermoelectric leg 140 may have a stack-type structure. For example, the P-type thermoelectric leg or the N-type thermoelectric leg may be formed by a method of stacking a plurality of structures coated with a semiconductor material on a sheet-shaped base and then cutting the plurality of structures. Therefore, it is possible to prevent a loss of a material and improve electrical conduction characteristics. Since each structure may further include an electrical conduction layer with an opening pattern, it is possible to increase a bonding strength between the structures, reduce thermal conductivity, and increase electrical conductivity.

Alternatively, the P-type thermoelectric leg 130 or the N-type thermoelectric leg 140 may be formed to have different cross-sectional areas in one thermoelectric leg. For example, cross-sectional areas of both end portions disposed toward the electrodes in one thermoelectric leg may be greater than a cross-sectional area between the both end portions. Therefore, since a temperature difference between the both end portions may be large, it is possible to increase thermoelectric efficiency.

The performance of the thermoelectric element according to one embodiment of the present invention may be expressed as a thermoelectric figure of merit (ZT). The ZT can be expressed as in Equation 1.

$$ZT = \alpha^2 \cdot \sigma \cdot T/K \qquad \text{[Equation 1]}$$

Here, α denotes a Seebeck coefficient [V/K], σ denotes an electrical conductivity [S/m], and $\alpha^2 \sigma$ denotes a power factor [W/mk$^2$]. In addition, T denotes a temperature, and k denotes a thermal conductivity [W/mK]. k can be expressed as a·cp·ρ, in which a denotes a thermal diffusivity [cm$^2$/S], cp denotes a specific heat [J/gK], and ρ denotes a density [g/cm$^3$].

In order to obtain a thermoelectric performance index of the thermoelectric element, a Z value (V/K) may be measured using a Z meter, and the ZT may be calculated using the measured Z value.

Here, the lower electrode 120 disposed between the lower substrate 110 and the P-type thermoelectric leg 130 and the N-type thermoelectric leg 140, and the upper electrode 150 disposed between the upper substrate 160 and the P-type thermoelectric leg 130 and the N-type thermoelectric leg 140 may include at least one of copper (Cu), silver (Ag), aluminum (Al), and nickel (Ni) and have a thickness of 0.01 to 0.3 mm. When a thickness of the lower electrode 120 or the upper electrode 150 is smaller than 0.01 mm, a function as an electrode may be degraded, thereby reducing the electrical conduction performance, and when the thickness exceeds 0.3 mm, the electrical conduction efficiency can be reduced due to an increase in resistance.

In addition, the lower substrate 110 and the upper substrate 160 facing each other may be metal substrates, and thicknesses thereof may be in a range of 0.1 to 1.5 mm. When the thickness of the metal substrate is smaller than 0.1 mm or more than 1.5 mm, the heat radiation characteristics or thermal conductivity may be excessively high, thereby reducing the reliability of the thermoelectric element. In addition, when the lower substrate 110 and the upper substrate 160 are metal substrates, an insulating layer 170 may be further formed between the lower substrate 110 and the lower electrode 120 and between the upper substrate 160 and the upper electrode 150. The insulating layer 170 may contain a material with a thermal conductivity of 1 to 20 W/mK.

In this case, the lower substrate 110 and the upper substrate 160 may be formed to have different sizes. For example, a volume, thickness, or area of one of the lower substrate 110 and the upper substrate 160 may be formed to be greater than a volume, thickness, or area of the other thereof. Therefore, it is possible to enhance the heat absorption or heat radiation performance of the thermoelectric element. For example, at least one of a volume, thickness, or area of a substrate which is disposed in a high-temperature area for the Seebeck effect, which is applied as a heating area for the Peltier effect, or on which a sealing member for protecting a thermoelectric module from an external environment is disposed may be greater than at least one of a volume, thickness, or area of the other thereof.

In addition, a heat radiation pattern, for example, an uneven pattern may be formed on a surface of at least one of the lower substrate 110 and the upper substrate 160. Therefore, it is possible to enhance the heat radiation performance of the thermoelectric element. When the uneven pattern is formed on the surface in contact with the P-type thermoelectric leg 130 or the N-type thermoelectric leg 140, it is possible to improve the bonding characteristics between the thermoelectric leg and the substrate. The thermoelectric element 100 includes the lower substrate 110, the lower electrode 120, the P-type thermoelectric leg 130, the N-type thermoelectric leg 140, the upper electrode 150, and the upper substrate 160.

As illustrated in FIGS. 4 and 5, a sealing member 190 may be further disposed between the lower substrate 110 and the upper substrate 160. The sealing member 190 may be disposed on side surfaces of the lower electrode 120, the P-type thermoelectric leg 130, the N-type thermoelectric leg 140, and the upper electrode 150 between the lower substrate 110 and the upper substrate 160. Therefore, the lower electrode 120, the P-type thermoelectric leg 130, the N-type thermoelectric leg 140, and the upper electrode 150 may be sealed from external moisture, heat, contamination, or the like. Here, the sealing member 190 may include a sealing case 192 disposed to be spaced a predetermined distance from side surfaces of outermost portions of the plurality of lower electrodes 120, outermost portions of the plurality of P-type thermoelectric legs 130 and the plurality of N-type thermoelectric legs 140, and outermost portions of the plurality of upper electrodes 150, a sealing part 194 disposed between the sealing case 192 and the lower substrate 110, and a sealing part 196 disposed between the sealing case 192 and the upper substrate 160. As described above, the sealing case 192 may come into contact with the lower substrate 110 and the upper substrate 160 through the sealing parts 194 and 196. Therefore, in a case in which the sealing case 192 is in direct contact with the lower substrate 110 and the upper substrate 160, heat conduction occurs through the sealing case 192, and as a result, it is possible to solve a problem that the temperature difference between the lower substrate 110 and the upper substrate 160 is reduced. Here, the sealing parts 194 and 196 may include at least one of epoxy resin and silicone resin or include a tape having both surfaces coated with at least one of epoxy resin and silicone resin. The sealing parts 194 and 194 may function to make airtightness between the sealing case 192 and the lower substrate 110 and between the sealing case 192 and the upper substrate 160, can further improve the sealing effect of the lower electrode 120, the P-type thermoelectric leg 130, the N-type thermoelectric leg 140, and the upper electrode 150, and can be used interchangeably with a finishing part, a finishing layer, a waterproofing part, a waterproofing layer, or the like. Here, the sealing part 194 for sealing between the sealing case 192 and the lower substrate 110 may be disposed on an upper surface of the lower substrate 110, and the sealing part 196 for sealing between the sealing case 192 and the upper substrate 160 may be disposed on the side surface of the upper substrate 160. Meanwhile, guide grooves G for drawing out the lead wires 181 and 182 connected to the electrodes may be formed in the sealing case 192. To this end, the sealing case 192 may be an injection-molded product made of plastic or the like and used interchangeably with a sealing cover. However, the above description of the sealing member is merely an example, and the sealing member may be modified into various forms. Although not illustrated, an insulating part may be further included to surround the sealing member. Alternatively, the sealing member may include an insulating component.

As descried above, the terms "lower substrate 110," "lower electrode 120," "upper electrode 150," and "upper substrate 160" are used, but are arbitrarily referred to as an upper portion and a lower portion for ease of understanding and convenience of description, and the positions may be reversed so that the lower substrate 110 and the lower electrode 120 are disposed above, and the upper electrode 150 and the upper substrate 160 are disposed below.

Meanwhile, according to the embodiment of the present invention, the electrode and thermoelectric leg may be bonded by solder. Voids present in the solder after the reflow process for bonding the electrode and the thermoelectric leg can degrade the reliability of the thermoelectric element. According to the embodiment of the present invention, it is intended to improve the long-term reliability of the thermoelectric element by minimizing the voids in the solder between the electrode and the thermoelectric leg.

Figure 6:
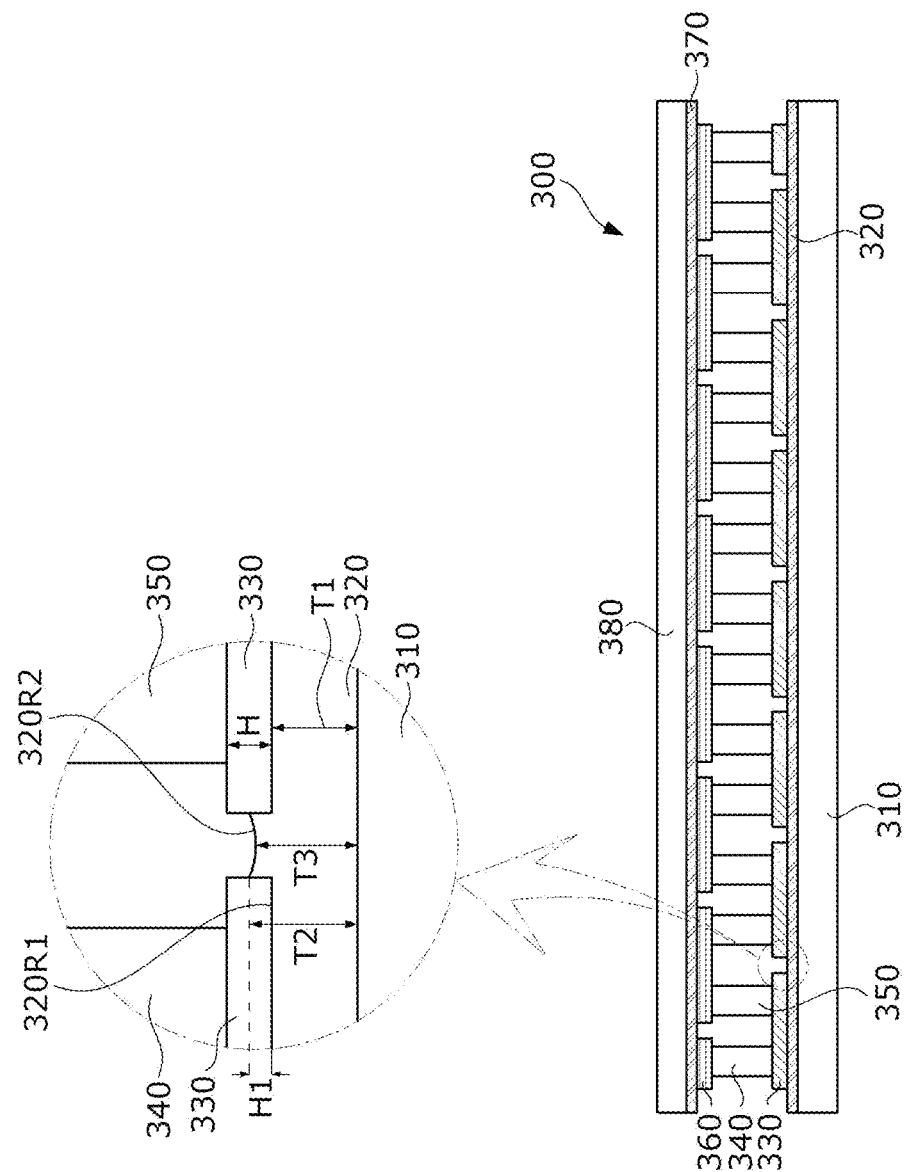
FIG. 6 is a cross-sectional view of the thermoelectric element according to one embodiment of the present invention.

FIG. 6 is a cross-sectional view of the thermoelectric element according to one embodiment of the present invention. Overlapping descriptions of the contents that are the same as those described with reference to FIGS. 2 to 5 will be omitted.

Referring to FIG. 6, a thermoelectric element 300 according to the embodiment of the present invention includes a first substrate 310, a first insulating layer 320 disposed on the first substrate 310, a plurality of first electrodes 330 disposed on the first insulating layer 320, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a second insulating layer 370 disposed on the plurality of second electrodes 360, and a second substrate 380 disposed on the second insulating layer 370.

The descriptions of the first substrate 110, the first electrode 120, the P-type thermoelectric legs 130, the N-type thermoelectric leg 140, the second electrode 150, and the second substrate 160, which are described with reference to FIGS. 2 to 5, may be applied to each of the first substrate 330, the first electrode 330, the P-type thermoelectric leg 340, the N-type thermoelectric leg 350, the second electrode 360, and the second substrate 380 in the same manner.

Although not illustrated in FIG. 6, a heat sink may be further disposed on the first substrate 310 or the second substrate 380, and a sealing member may be further disposed between the first substrate 310 and the second substrate 380.

According to the embodiment of the present invention, the first insulating layer 320 is disposed on the first substrate 310, and the first electrode 330 is disposed on the first insulating layer 320. In this case, a portion of the side surface of the first electrode 330 may be buried in the first insulating layer 320. For example, a height H1 of the side surfaces of the plurality of first electrodes 330 buried in the first insulating layer 320 may be in a range of 0.1 to 1 times, preferably in a range of 0.2 to 0.9 times, and more preferably in a range of 0.3 to 0.8 times a thickness H of the plurality of first electrodes 330. As described above, when the portions of the side surfaces of the plurality of first electrodes 330 are buried in the first insulating layer 320, contact areas between the plurality of first electrodes 330 and the first insulating layer 320 may increase, and thus it is possible to further improve the thermal interface performance and bonding strength between the plurality of first electrodes 330 and the first insulating layer 320. When the heights H1 of the side surfaces of the plurality of first electrodes 330 buried in the first insulating layer 320 are smaller than 0.1 times the thicknesses H of the plurality of first electrodes 330, it may be difficult to sufficiently obtain the thermal interface performance and bonding strength between the plurality of first electrodes 330 and the first insulating layer 320, and when the heights H1 of the side surfaces of the plurality of first electrodes 330 buried in the first insulating layer 320 exceed 1 time the thicknesses H of the plurality of first electrodes 330, the first insulating layer 320 may move on the plurality of first electrodes 330, and thus an electrical short circuit may likely occur.

Therefore, an upper surface of the first insulating layer 320 may include a first concave surface 320R1 vertically overlapping the first electrode 330 and a second concave surface 320R2 not vertically overlapping the first electrode 330. The first electrode 330 may be disposed on the first concave surface 320R1, and a first vertical distance T1 between the first concave surface 320R1 and the first substrate 310 may be smaller than second vertical distances T2 and T3 between the second concave surface 320R2 and the first substrate 310. More specifically, a thickness of the first insulating layer 320 between the plurality of first electrodes 330 may decrease from the side surface of each electrode toward a central area so that a vertex may have a smooth "V" shape. Therefore, the first insulating layers 320 between the plurality of first electrodes 330 may have a thickness deviation, and heights T2 in areas in direct contact with the side surfaces of the plurality of first electrodes 330 may be the highest, heights T3 in the central areas may be smaller than the heights T2 in the areas in direct contact with the side surfaces of the plurality of first electrodes 330. In other words, the heights T3 of the central areas of the first insulating layers 320 between the plurality of first electrodes 330 may be the lowest in the first insulating layers 320 between the plurality of first electrodes 330. In addition, the heights T1 of the first insulating layers 320 under the plurality of first electrodes 330 may be much smaller than the heights T3 in the central areas of the first insulating layers 320 between the plurality of first electrodes 330. Since the first insulating layer 320 includes the second concave surface 320R2, it is possible to reduce a stress applied to the first insulating layer, thereby solving a problem such as cracks or delamination of the insulating layer.

In addition, the first concave surface 320R1 may be disposed to have a width that is greater than a width of the second concave surface 320R2. Therefore, since a structure in which an electrode is densely disposed on a substrate can be possible, it is possible to improve the power generation performance or temperature control performance of the thermoelectric element.

Meanwhile, although not illustrated, the first insulating layer 320 may include a 1-1 insulating layer disposed on the first substrate 310 and a 1-2 insulating layer disposed on the 1-1 insulating layer, and the first concave surface 320R1 and the second concave surface 320R2 may be included in the 1-2 insulating layer. In this case, the 1-1 insulating layer may exemplarily include a resin material and include a composite containing silicon and aluminum, and an inorganic filler. Here, the composite may be an organic-inorganic composite consisting of an inorganic material containing Si and Al elements and alkyl chain and may be at least one of an oxide, a carbide, and a nitride combined with silicon and aluminum. For example, the composite may include at least one of an Al—Si bond, an Al—O—Si bond, a Si—O bond, an Al—Si—O bond, and an Al—O bond. As described above, the composite containing at least one of the Al—Si bond, the Al—O—Si bond, the Si—O bond, the Al—Si—O bond, and the Al—O bond may have excellent insulation performance, thereby obtaining high withstand voltage performance. Alternatively, the composite may be an oxide, a carbide, or a nitride additionally combined with titanium, zirconium, boron, zinc, or the like together with silicon and aluminum. To this end, the composite can be obtained through a process of mixing aluminum with at least one of an inorganic binder and an organic-inorganic mixed binder and then thermally treating the mixture. The inorganic binder may include, for example, at least one of silica ($SiO_2$), metal alkoxide, boron oxide ($B_2O_3$), and zinc oxide ($ZnO_2$). The inorganic binder is an inorganic particle and may function as a binding by being turned into sol or gel when coming into contact with water. In this case, at least one of silica ($SiO_2$), metal alkoxide, and boron oxide ($B_2O_3$) functions to increase a bonding strength with aluminum or a bonding strength with the first substrate 310, and zinc oxide ($ZnO_2$) may function to increase a strength and thermal conductivity of the 1-1 insulating layer. Inorganic fillers may be dispersed in the composite and may include at least one of aluminum oxide and a nitride. Here, the nitride may include at least one of boron nitride and aluminum nitride.

Meanwhile, the 1-2 insulating layer may be made of a resin layer containing at least one of an epoxy resin composition containing epoxy resin and an inorganic filler and a silicone resin composition containing polydimethylsiloxane (PDMS). Therefore, the 1-2 insulating layer can improve the insulation, bonding strength, and thermal conduction performance between the 1-1 insulating layer and the first electrode 330.

Here, the inorganic filler may be included in the resin layer at 60 to 80 wt %. When the inorganic filler is included at smaller than 60 wt %, the thermal conduction effect may be reduced, and when the inorganic filler is included at more than 80 wt %, it is difficult for the inorganic fillers to be evenly dispersed in the resin, and the resin layer may be easily broken.

In addition, the epoxy resin may include an epoxy compound and a curing agent. In this case, the curing agent may be included in an amount of 1 to 10 volumes relative to 10 volumes of the epoxy compound. Here, the epoxy compound may include at least one of a crystalline epoxy compound, an amorphous epoxy compound, and a silicone epoxy compound. The inorganic filler may include at least one of aluminum oxide and a nitride. Here, the nitride may include at least one of boron nitride and aluminum nitride.

Therefore, since compositions of the 1-1 insulating layer and the 1-2 insulating layer differ from each other and thus at least one of a hardness, elastic modulus, tensile strength, elongation, and Young's modulus of the 1-1 insulating layer and the 1-2 insulating layer may change, it is possible to control withstand voltage performance, thermal conduction performance, bonding performance, and thermal impact reduction performance. In this case, a thickness of the 1-2 insulating layer may be more than 1 time and 3.5 times or less, preferably 1.05 times or more and 2 times or less, and more preferably 1.1 times or more and 1.5 times or less a thickness of the 1-1 insulating layer. When the thickness of the 1-1 insulating layer and the thickness of the 1-2 insulating layer each satisfy these numerical ranges, it is possible to obtain withstand voltage performance, thermal conduction performance, bonding performance, and thermal impact reduction performance at the same time. In addition, the 1-1 insulating layer and the 1-2 insulating layer may have different thermal expansion coefficients. Therefore, when the thermoelectric element 300 is exposed to a high temperature for a long time, a phenomenon in which the thermoelectric element 300 is bent by a stress may occur, the long-term reliability and durability of the thermoelectric element can be degraded, and the power generation performance of a power-generation device can be reduced when the thermoelectric element is applied to the power generation device.

According to the embodiment of the present invention, the first electrode 330 and the thermoelectric legs 340 and 350 may be bonded by a bonding layer 600.

Hereinafter, overlapping descriptions of the contents that are the same as those described with reference to FIGS. 2 to 6 will be omitted.

Figure 7:
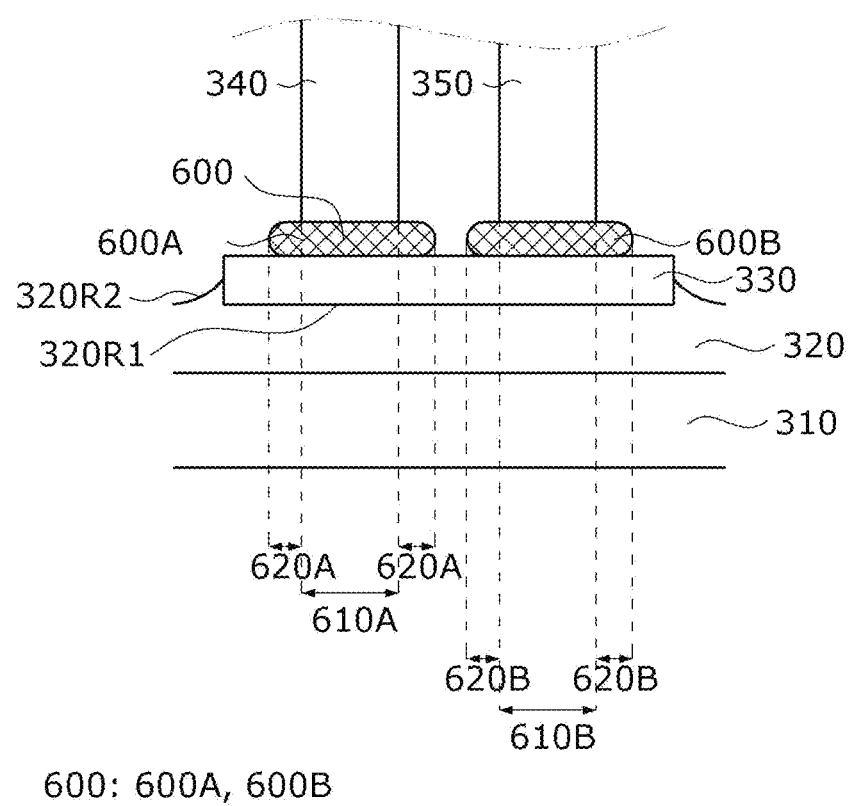
FIG. 7 is a cross-sectional view of a portion of the thermoelectric element according to one embodiment of the present invention.
Figure 8:
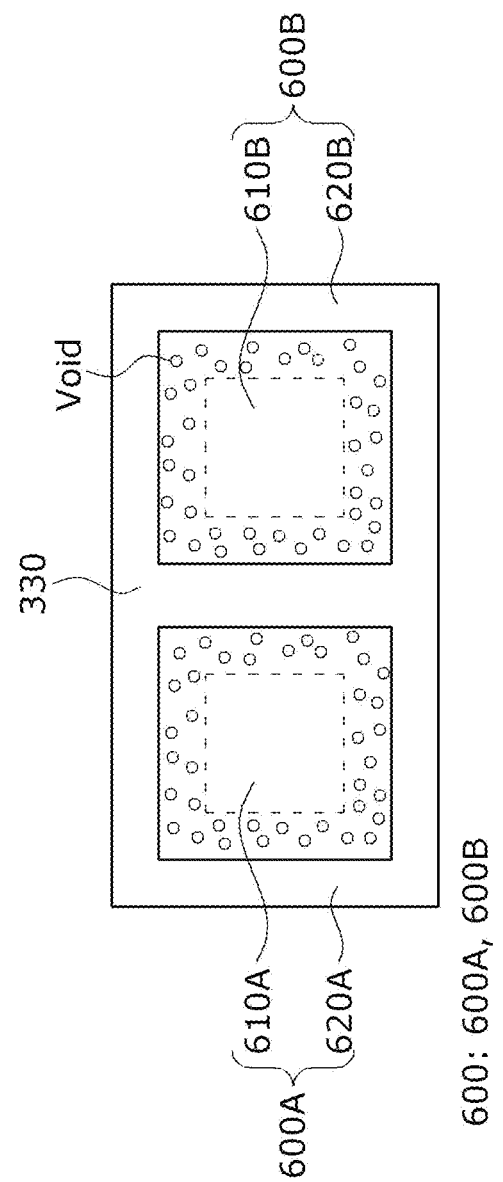
FIG. 8 is a top view of a first electrode and a bonding layer included in the thermoelectric element according to one embodiment of the present invention.

FIG. 7 is a cross-sectional view of a portion of the thermoelectric element according to one embodiment of the present invention, and FIG. 8 is a top view of a first electrode and a bonding layer included in the thermoelectric element according to one embodiment of the present invention.

Referring to FIG. 7, according to the embodiment of the present invention, the bonding layer 600 is disposed on the first electrode 330, and the P-type thermoelectric leg 340 and the N-type thermoelectric leg are disposed on the bonding layer 600. Here, the bonding layer 600 may include solder. The solder may include, for example, at least one of tin (Sn), antimony (Sb), and compounds containing the same, but is not limited thereto, and may be formed by including a compound of at least one of bismuth (Bi), silver (Ag), copper (Cu), and lead (Pb).

Referring to FIGS. 7 and 8, the bonding layer 600 includes first areas 610A and 610B vertically overlapping the first concave surface 320R1 of the first insulating layer 320 and the P-type thermoelectric leg 340 or the N-type thermoelectric leg 350, and second areas 620A and 620B vertically overlapping the first concave surface 320R1 of the first insulating layer 320 and not vertically overlapping the P-type thermoelectric leg 340 or the N-type thermoelectric leg 350. When the bonding layer 600 vertically overlaps the first concave surface 320R1 of the first insulating layer 320, even when the first substrate 310 and the first electrode 330 are exposed to a high temperature during the reflow process for bonding the first electrode 330 to the P-type thermoelectric leg 340 or the N-type thermoelectric leg 350, the first insulating layer 320 may cushion a thermal impact applied to the first substrate 310 and the first electrode 330 and in particular, cushion a thermal impact applied to side surfaces of the first electrode 330 as well as a bottom surface of the first electrode 330.

In this case, the second areas 620A and 620B may be disposed to surround the first areas 610A and 610B. Therefore, during the reflow process for bonding the first electrode 330 to the P-type thermoelectric leg 340 or the N-type thermoelectric leg 350 using the bonding layer 600, gases in the first areas 610A and 610B may be discharged to the outside through the second areas 620A and 620B not vertically overlapping the P-type thermoelectric leg 340 or the N-type thermoelectric leg 350. Therefore, void densities of the first areas 610A and 610B may be smaller than void densities of the second areas 620A and 620B. For example, the void densities of the first areas 610A and 610B may be in a range of 0.1 to 0.95 times, preferably in a range of 0.1 to 0.5 times, and more preferably in a range of 0.1 to 0.3 times the void densities of the second areas 620A and 620B. Here, the void may be an empty space not filled with solder inside the bonding layer 600, and the void density may be the number of voids per unit volume or a volume of a void per unit volume. Alternatively, the void density may be the number of voids per unit area or an area of a void per unit area with respect to any cut surface in the bonding layer 600. Therefore, it is possible to minimize the voids between the first electrode 330 and the P-type thermoelectric leg 340 or the N-type thermoelectric leg 350 and increase the reliability of the thermoelectric element.

To this end, in order to proceed with the reflow process, the first electrode 330 may be coated with solder that is 1 time, preferably 1.2 times or more, and more preferably 1.4 times or more the area of the P-type thermoelectric leg 340 or the N-type thermoelectric leg 350. Therefore, even when the solder shrinks during the reflow process, the bonding layer 600 may include the second areas 620A and 620B not vertically overlapping the P-type thermoelectric leg 340 or the N-type thermoelectric leg 350, and the gases in the first areas 610A and 610B may be discharged to the outside through the second areas 620A and 620B.

In this case, the area of the bonding layer 600 may be 1.4 times or less the area of the P-type thermoelectric leg 340 or the N-type thermoelectric leg 350. Therefore, it is possible to minimize the void densities of the first areas 610A and 610B of the bonding layer 600 and solve a problem that the P-type thermoelectric leg 340 or the N-type thermoelectric leg 350 slips or is twisted due to excessive coating with the solder and thus a problem that the bonding strength between the P-type thermoelectric leg 340 or the N-type thermoelectric leg 350 and the first electrode 330 is reduced or the P-type thermoelectric leg 340 and the N-type thermoelectric leg 350 are short-circuited.

Meanwhile, the bonding layer 600 includes a first bonding layer 600A disposed between the first electrode 330 and the P-type thermoelectric leg 340, and a second bonding layer 600B disposed between the first electrode 330 and the N-type thermoelectric leg 350. In this case, the first bonding layer 600A and the second bonding layer 600B may include an area not vertically overlapping the P-type thermoelectric leg 340 and the N-type thermoelectric leg 350, respectively.

In this case, the first bonding layer 600A and the second bonding layer 600B may be disposed to be spaced apart from each other on the first electrode 330. Alternatively, the first bonding layer 600A and the second bonding layer 600B may be connected on the first electrode 330 between the P-type thermoelectric leg 340 and the N-type thermoelectric leg 350.

Figure 10:
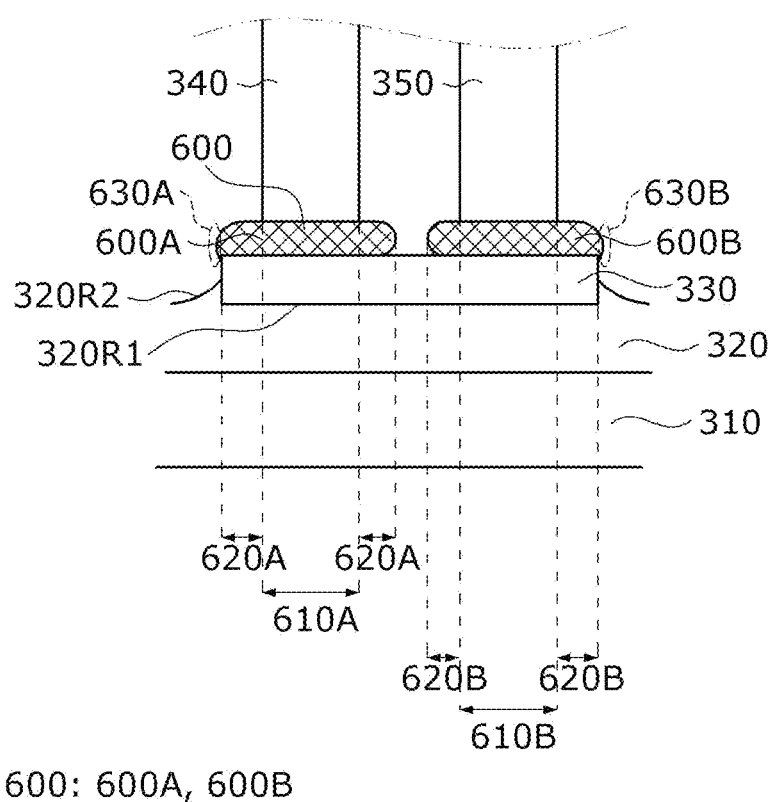
Figure 11:
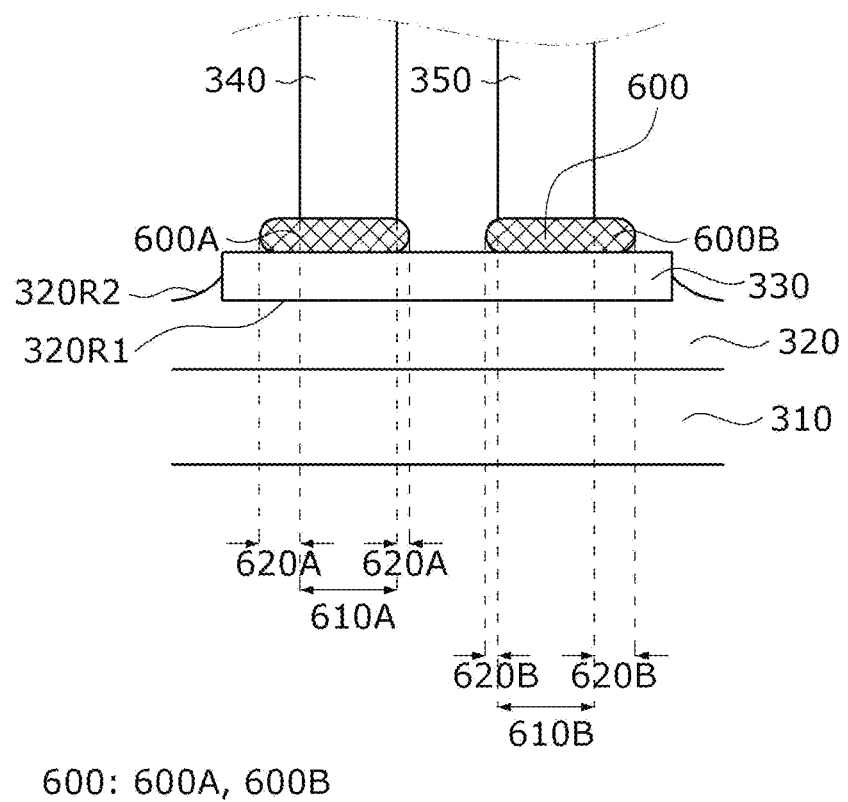

FIGS. 9 to 11 are cross-sectional views of a portion of a thermoelectric element according to another embodiment of the present invention.

Referring to FIG. 9A, the bonding layer 600 includes the first areas 610A and 610B vertically overlapping the first concave surface 320R1 of the first insulating layer 320 and the P-type thermoelectric leg 340 or the N-type thermoelectric leg 350, and the second areas 620A and 620B vertically overlapping the first concave surface 320R1 of the first insulating layer 320 and not vertically overlapping the P-type thermoelectric leg 340 or the N-type thermoelectric leg 350. In this case, the second areas 620A and 620B may be disposed to surround the first areas 610A and 610B.

In this case, a maximum thickness L2 of the second areas 620A and 620B may be greater than a maximum thickness L1 of the first areas 610A and 610B. This means that during the reflow process for bonding the first electrode 330 to the P-type thermoelectric leg 340 or the N-type thermoelectric leg 350 using the bonding layer 600, the solder with which the first electrode 330 is coated may shrink and at the same time, a path and area of the gas in the first areas 610A and 610B that may be discharged to the outside through the second areas 620A and 620B may increase. For example, referring to FIG. 9B, at least portions of the second areas 620A and 620B may be disposed on the side surface of the P-type thermoelectric leg 340 or the N-type thermoelectric leg 350. Therefore, it is possible to increase the bonding strength between the first electrode 330 and the P-type thermoelectric leg 340 or the N-type thermoelectric leg 350 at an edge of the P-type thermoelectric leg 340 or the N-type thermoelectric leg 350.

Referring to FIG. 10, the bonding layer 600 includes the first area 610 vertically overlapping the first concave surface 320R1 of the first insulating layer 320 and the P-type thermoelectric leg 340 or the N-type thermoelectric leg 350, and the second area 620 vertically overlapping the first concave surface 320R1 of the first insulating layer 320 and not vertically overlapping the P-type thermoelectric leg 340 or the N-type thermoelectric leg 350. In this case, the second area 620 may be disposed to surround the first area 610.

Meanwhile, the bonding layer 600 may further include a third area 630 vertically overlapping the second concave surface 320R2 of the first insulating layer 320 on the side surface of the first electrode 330. The third area 630 may be disposed on a portion of the side surface of the first electrode 330, but may be disposed not to be in contact with the second concave surface 320R2. Therefore, it is possible to solve a problem that a portion of the bonding layer 300 overflows out of the first electrode 330 and is electrically connected to the neighboring first electrode 330. In addition, during the reflow process for bonding the first electrode 330 to the P-type thermoelectric leg 340 or the N-type thermoelectric leg 350 using the bonding layer 600, the solder with which the first electrode 330 is coated may shrink and at the same time, a path of the gas in the first area 610 discharged to the outside through the second area 620 and the third area 630 may increase.

Referring to FIG. 11, the bonding layer 600 includes the first areas 610A and 610B vertically overlapping the first concave surface 320R1 of the first insulating layer 320 and the P-type thermoelectric leg 340 or the N-type thermoelectric leg 350, and the second areas 620A and 620B vertically overlapping the first concave surface 320R1 of the first insulating layer 320 and not vertically overlapping the P-type thermoelectric leg 340 or the N-type thermoelectric leg 350. In this case, the second areas 620A and 620B may be disposed to surround the first areas 610A and 610B.

In this case, a horizontal width of each of the second areas 620A and 620B disposed between the P-type thermoelectric leg 340 and the N-type thermoelectric leg 350 may be smaller than a horizontal width of each of the second areas 620A and 620B disposed between the P-type thermoelectric leg 340 or the N-type thermoelectric leg 350 and the edge of the first electrode 330. Therefore, it is possible to solve the problem that the P-type thermoelectric leg 340 or the N-type thermoelectric leg 350 slips or is twisted due to the solder disposed between the P-type thermoelectric leg 340 and the N-type thermoelectric leg 350 and thus the P-type thermoelectric leg 340 and the N-type thermoelectric leg 350 are bonded and short-circuited, the solder with which the first electrode 330 is coated may shrink during the reflow process for bonding the first electrode 330 to the P-type thermoelectric leg 340 or the N-type thermoelectric leg 350 using the bonding layer 600, and at the same time, the paths and areas of the gases in the first areas 610A and 610B discharged to the outside through the second areas 620A and 620B may increase.

Figure 12:
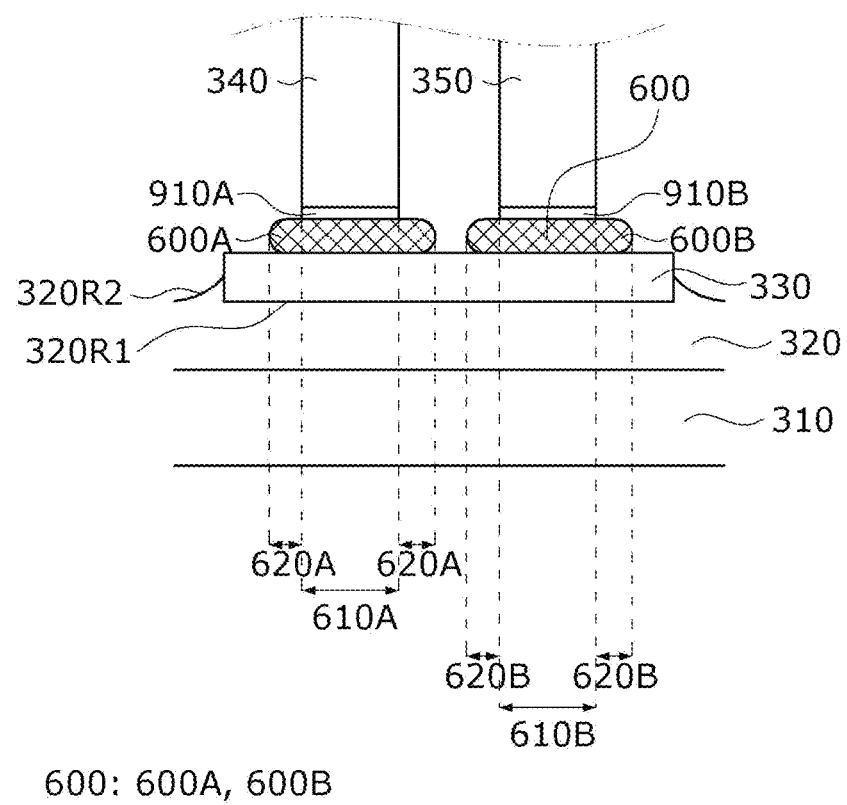
FIGS. 12 and 13 are cross-sectional views of a portion of a thermoelectric element according to still another embodiment of the present invention.
Figure 13:
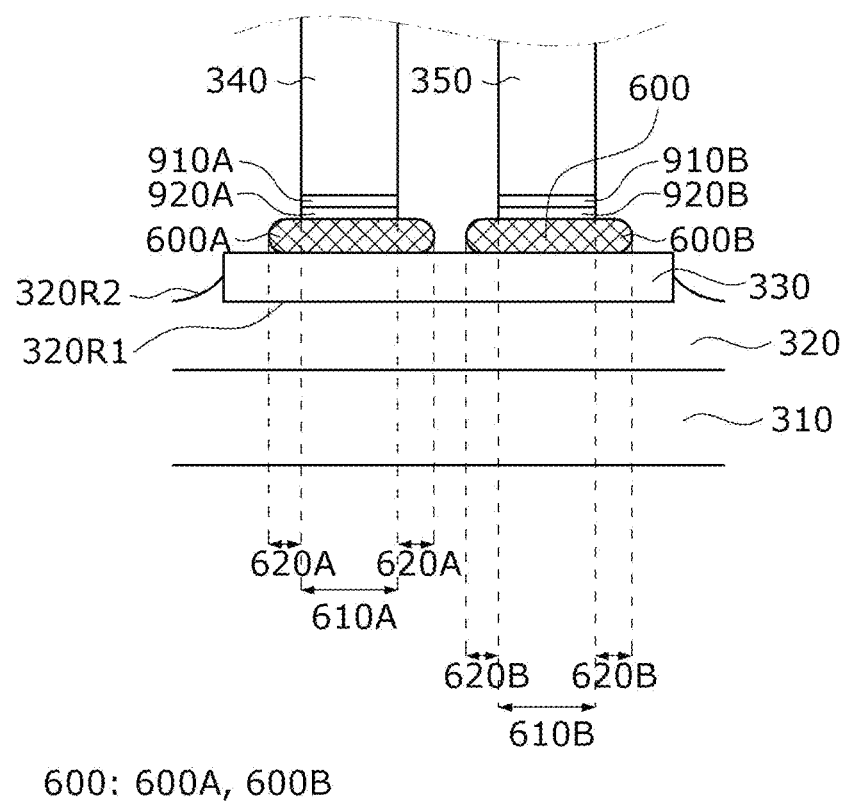

FIGS. 12 and 13 are cross-sectional views of a portion of a thermoelectric element according to still another embodiment of the present invention.

Referring to FIGS. 12 and 13, the bonding layer 600 includes the first area 610 vertically overlapping the first concave surface 320R1 of the first insulating layer 320 and the P-type thermoelectric leg 340 or the N-type thermoelectric leg 350, and the second areas 620A and 620B vertically overlapping the first concave surface 320R1 of the first insulating layer 320 and not vertically overlapping the P-type thermoelectric leg 340 or the N-type thermoelectric leg 350. In this case, the second areas 620A and 620B may be disposed to surround the first areas 610A and 610B.

Referring to FIG. 12, the P-type thermoelectric leg 340 or the N-type thermoelectric leg 350 may include thermoelectric material layers 900A and 900B containing bismuth (Bi)-tellurium (Te), and diffusion prevention layers 910A and 910B disposed on one surfaces of the thermoelectric material layers 900A and 900B. In this case, the diffusion prevention layers 910A and 910B may contain nickel (Ni). Therefore, since the diffusion prevention layers 910A and 910B prevents Bi or Te, which is a semiconductor material in the thermoelectric material layers 900A and 900B, from diffusing into the electrode, it is possible to prevent the degradation of the performance of the thermoelectric element, and since the wettability with the bonding layer 600 is excellent, it is possible to increase the bonding strength between the first electrode 330 and the P-type thermoelectric leg 340 or the N-type thermoelectric leg 350.

Referring to FIG. 13, the P-type thermoelectric leg 340 or the N-type thermoelectric leg 350 may include the thermoelectric material layers 900A and 900B containing bismuth (Bi)-tellurium (Te), the diffusion prevention layers 910A and 910B disposed on the one surfaces of the thermoelectric material layers 900A and 900B, and metal layers 920A and 920B disposed on one surfaces of the diffusion prevention layers 910A and 910B. Here, the diffusion prevention layers 910A and 910B may be disposed between the thermoelectric material layers 900A and 900B and the metal layers 920A and 920B. In this case, the diffusion prevention layers 910A and 910B may contain nickel (Ni), and the metal layers 920A and 920B may contain tin (Sn). Therefore, since the diffusion prevention layers 910A and 910B prevents Bi or Te, which is a semiconductor material in the thermoelectric material layers 900A and 900B, from diffusing into the electrode, it is possible to prevent the degradation of the performance of the thermoelectric element. In addition, since the metal layers 920A and 920B have excellent wettability with the bonding layer 600, it is possible to increase the bonding strength between the first electrode 330 and the P-type thermoelectric leg 340 or the N-type thermoelectric leg 350.

Figure 14:
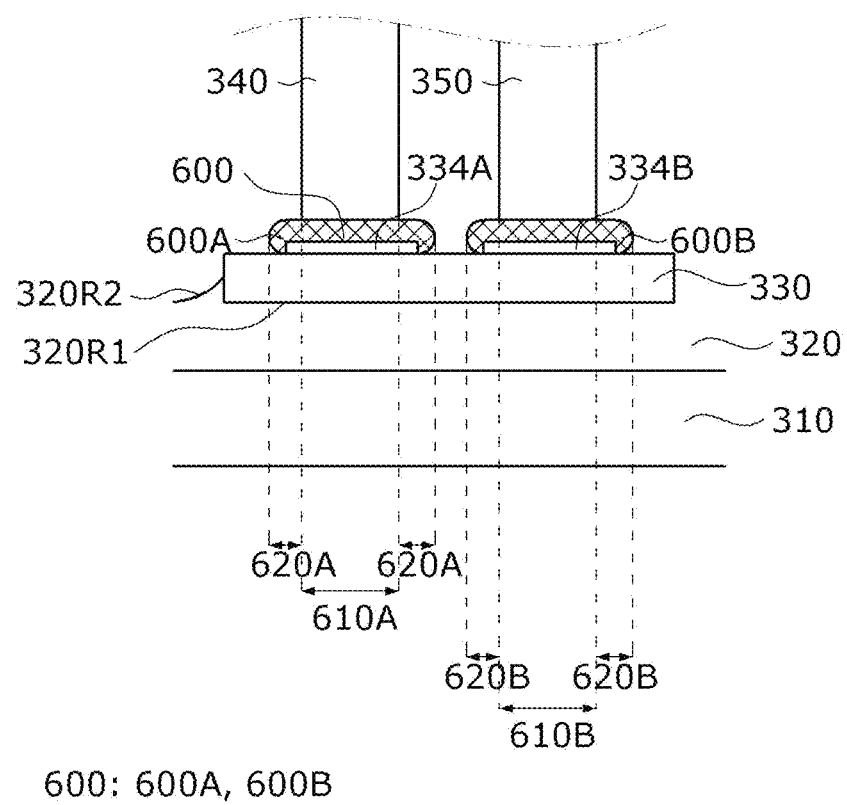
FIG. 14 is a cross-sectional view of a portion of the thermoelectric element according to yet another embodiment of the present invention.

FIG. 14 is a cross-sectional view of a portion of the thermoelectric element according to yet another embodiment of the present invention.

Referring to FIG. 14, the bonding layer 600 includes the first areas 610A and 610B vertically overlapping the first concave surface 320R1 of the first insulating layer 320 and the P-type thermoelectric leg 340 or the N-type thermoelectric leg 350, and the second areas 620A and 620B vertically overlapping the first concave surface 320R1 of the first insulating layer 320 and not vertically overlapping the P-type thermoelectric leg 340 or the N-type thermoelectric leg 350. In this case, the second areas 620A and 620B may be disposed to surround the first areas 610A and 610B.

In this case, plating layers 334A and 334B may be disposed on the first electrode 330. The plating layers 334A and 334B may be disposed on a surface disposed to face the P-type thermoelectric leg 340 and the N-type thermoelectric leg 350 of both surfaces of the first electrode 330. The plating layers 334A and 334B may include, for example, nickel (Ni), but are not limited thereto, and any metal capable of improving the wettability between the first electrode 330 and the bonding layer 600 and preventing the diffusion of ions in the first electrode 330, such as palladium (Pd), tin (Sn), or molybdenum (Mo), can be applied to the plating layers 334A and 334B.

According to the embodiment of the present invention, areas of the plating layers 334A and 334B may be smaller than the area of the first electrode 330. For example, the plating layers 334A and 334B may be disposed on a portion of the first electrode 330, and the plating layer 334A for the P-type thermoelectric leg 340 and the plating layer 334B for the N-type thermoelectric leg 350 may be disposed to be spaced apart from each other, and the plating layers 334A and 334B may each be disposed in one of areas spaced apart from the edge of the first electrode 330. Therefore, since the bonding layers 600A and 600B are disposed around the plating layers 334A and 334B, it is possible to minimize the possibility that the bonding layers 600A and 600B overflow out of the first electrode 330 and are connected to the neighboring first electrode 330 or are disposed between the P-type thermoelectric leg 340 and the N-type thermoelectric leg 350 to have an electrical influence. To this end, the plating layers 334A and 334B may be formed by a selective plating technique using masking on the first electrode 330 or may be plated on the entirety of the first electrode 330 and then patterned using a laser scribing technique or the like. In addition, the area of each of the plating layers 334A and 334B may be greater than or equal to an area of a surface disposed to face the first electrode 330 of both surfaces of each of the P-type thermoelectric leg 340 and the N-type thermoelectric leg 350. For example, the area of each of the plating layers 334A and 334B may be in a range of 1 to 1.4 times, preferably in a range of 1 to 1.3 times, and more preferably in a range of 1 to 1.2 times the area of the surface disposed to face the first electrode 330 of both surfaces of each of the P-type thermoelectric leg 340 and the N-type thermoelectric leg 350. Therefore, since the bonding layer 600 shrinks to the periphery of the plating layers 334A and 334B due to the wettability between the bonding layer 600 and the plating layers 334A and 334B in the process for bonding the first electrode 330 to the P-type thermoelectric leg 340 and the N-type thermoelectric leg 350, the bonding layer 600 may include the first areas 610A and 610B vertically overlapping the first concave surface 320R1 of the first insulating layer 320 and the P-type thermoelectric leg 340 and the N-type thermoelectric leg 350, and the second areas 620A and 620B vertically overlapping the first concave surface 320R1 of the first insulating layer 320 and not vertically overlapping the P-type thermoelectric leg 340 or the N-type thermoelectric leg 350. Therefore, since the gases in the first areas 610A and 610B are discharged to the outside through the second areas 620A and 620B, it is possible to reduce the void densities of the first areas 610A and 610B and increase the thermoelectric performance and reliability of the thermoelectric element.

Figure 15:
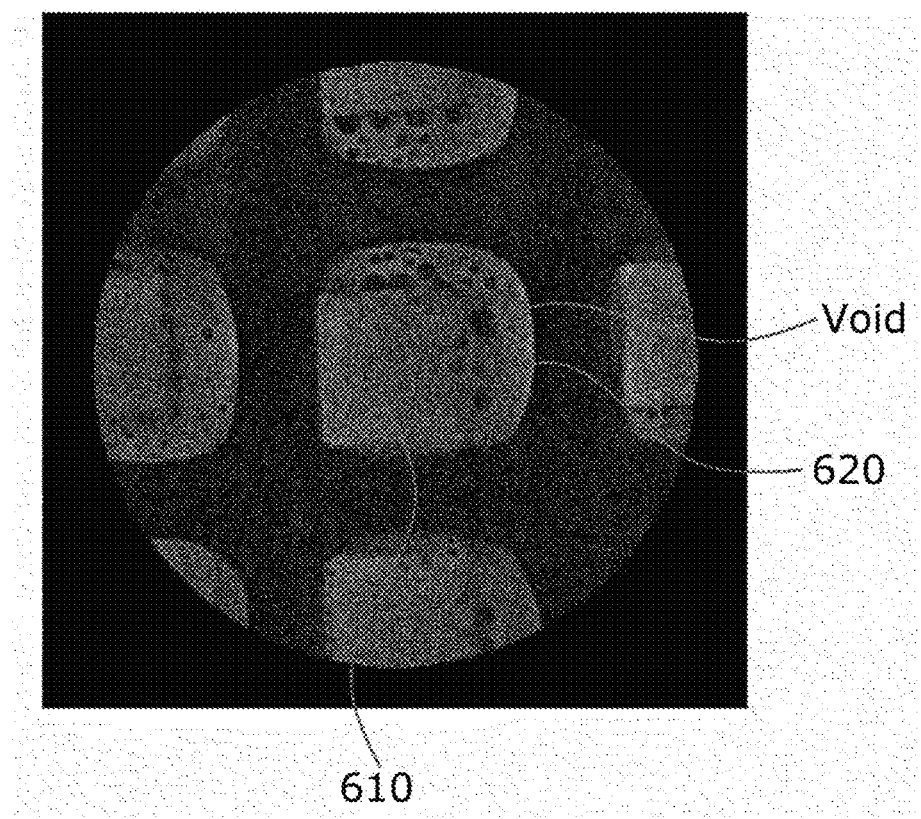
FIG. 15 is a photograph illustrating voids that are present in the solder layer in the thermoelectric element according to the embodiment of the present invention.

FIG. 15 is a photograph illustrating voids that are present in the solder layer in the thermoelectric element according to the embodiment of the present invention.

Referring to FIG. 15, it can be seen that the void density of the second area 620 not vertically overlapping the thermoelectric leg and disposed on the side surface of the first area 610 is higher than that of the first area 610 vertically overlapping the thermoelectric leg.

Although not illustrated, according to one embodiment of the present invention, a heat sink may be disposed on the second substrate of the thermoelectric element, and the thermoelectric element and the heat sink may be coupled by a plurality of coupling members. When the heat sink is disposed on the second substrate, the plurality of coupling members may fasten the heat sink and the second substrate, fasten the heat sink, the second substrate, and the first substrate, or fasten the heat sink, the second substrate, the first substrate, and a cooling unit (not illustrated). To this end, a through hole through which the coupling member passes may be formed in the heat sink, the second substrate, the first substrate, and the cooling unit. Here, a separate insulating insertion member may be further disposed between the through hole and the coupling member. The separate insulating insertion member may be an insulating insertion member surrounding an outer perimetric surface of the coupling member or an insulating insertion member surrounding a wall surface of the through hole. Therefore, it is possible to increase an insulation distance of the thermoelectric element.

Although not illustrated, when the thermoelectric element according to the embodiment of the present invention is applied to a power generation device using the Seebeck effect, the thermoelectric element may be coupled to a first fluid flow part and a second fluid flow part. The first fluid flow part may be disposed on one of the first substrate and the second substrate of the thermoelectric element, and the second fluid flow part may be disposed on the other of the first substrate and the second substrate of the thermoelectric element. A flow path may be formed in at least one of the first fluid flow part and the second fluid flow part to allow at least one of a first fluid and a second fluid to flow therethrough, and in some cases, at least one of the first fluid flow part and the second fluid flow part may be omitted, and at least one of the first fluid and the second fluid may flow directly to the substrate of the thermoelectric element. For example, the first fluid may flow adjacent to one of the first substrate and the second substrate, and the second fluid may flow adjacent to the other thereof. At this time, a temperature of the second fluid may be higher than a temperature of the first fluid. Therefore, the first fluid flow part may be referred to as a cooling unit. As another embodiment, the temperature of the first fluid may be much higher than the temperature of the second fluid. Therefore, the second fluid flow part may be referred to as a cooling unit. The heat sink may be connected to a substrate at a side through which the fluid with a higher temperature flows of the first fluid flow part and the second fluid flow part. An absolute value of a temperature difference between the first fluid and the second fluid may be 40° C. or higher, preferably 70° C. or higher, and more preferably 95 to 185° C.

Although the present invention has been described above with reference to exemplary embodiments, those skilled in the art will understand that the present invention may be modified and changed variously without departing from the spirit and scope of the present invention as described in the appended claims.

The invention claimed is:

1. A thermoelectric element comprising:
a first substrate;
an insulating layer disposed on the first substrate;
a first electrode disposed on the insulating layer;
a bonding layer disposed on the first electrode;
a semiconductor structure disposed on the bonding layer;
a second electrode disposed on the semiconductor structure; and
a second substrate formed on the second electrode,
wherein an upper surface of the insulating layer includes a first concave surface vertically overlapping the first electrode,
the bonding layer includes a first area vertically overlapping the first concave surface and the semiconductor structure, and a second area vertically overlapping the first concave surface and not vertically overlapping the semiconductor structure, and
a void density of the first area is smaller than a void density of the second area.

2. The thermoelectric element of claim 1, wherein the second area is disposed to surround the first area.

3. The thermoelectric element of claim 1, wherein a maximum thickness of the second area is greater than a maximum thickness of the first area.

4. The thermoelectric element of claim 1, wherein at least a portion of the second area is disposed on a side surface of the semiconductor structure.

5. The thermoelectric element of claim 1, wherein the upper surface of the insulating layer further includes a second concave surface not vertically overlapping the first electrode, and the bonding layer further includes a third area vertically overlapping the second concave surface at a side surface of the first electrode.

6. The thermoelectric element of claim 1, wherein an area of the bonding layer is 1.4 times or less an area of the semiconductor structure.

7. The thermoelectric element of claim 1, wherein the semiconductor structure includes a first semiconductor element and a second semiconductor element disposed to be spaced apart from each other on the first electrode, the bonding layer includes a first bonding layer disposed between the first electrode and the first semiconductor element, and a second bonding layer disposed between the first electrode and the second semiconductor element, and
the first bonding layer and the second bonding layer each include areas not vertically overlapping the first semiconductor element and the second semiconductor element.

8. The thermoelectric element of claim 7, wherein the first bonding layer and the second bonding layer are disposed to be spaced apart from each other on the first electrode.

9. The thermoelectric element of claim 7, further comprising a first plating layer disposed between the first electrode and the first bonding layer, and a second plating layer disposed between the first electrode and the second bonding layer,
wherein an area of each of the first plating layer and the second plating layer is greater than or equal to an area of a surface, which is disposed to face the first electrode, of each of the first semiconductor element and the second semiconductor element, and a sum of the area of the first plating layer and the area of the second plating layer is smaller than an area of the first electrode.

10. The thermoelectric element of claim 1, wherein the insulating layer includes a first insulating layer disposed on the first substrate and a second insulating layer disposed on the first insulating layer, and
the first concave surface and the second concave surface are included in the second insulating layer.

11. The thermoelectric element of claim 1, wherein the void density of the first area is in a range of 0.1 to 0.95 times the void density of the second area.

12. The thermoelectric element of claim 5, wherein the third area is in contact with the side surface of the first electrode.

13. The thermoelectric element of claim 12, wherein the third area is not in contact with the second concave surface.

14. The thermoelectric element of claim 1, wherein the semiconductor structure includes a first semiconductor element and a second semiconductor element disposed to be spaced apart from each other on the first electrode, and
wherein a horizontal width of the second area disposed between the first semiconductor element and the second semiconductor element is smaller than a horizontal width of the second area disposed between the first semiconductor element or the second semiconductor element and an edge of the first electrode.

15. The thermoelectric element of claim 1, further comprising a plating layer disposed between the first electrode and the bonding layer,
wherein an area of the plating layer is smaller than an area of the first electrode.

16. The thermoelectric element of claim 15, wherein the plating layer includes at least one of nickel (Ni), palladium (Pd), tin (Sn), and molybdenum (Mo).

17. The thermoelectric element of claim 15, wherein the plating layer is disposed spaced apart from an edge of the first electrode.

18. The thermoelectric element of claim 15, wherein the bonding layer is in contact with an upper surface of the plating layer and a side surface of the plating layer.

19. The thermoelectric element of claim 15, wherein the area of the plating layer is greater than or equal to an area of the semiconductor structure.

20. The thermoelectric element of claim 15, wherein the area of the plating layer is in a range of 1 to 1.4 times the area of the semiconductor structure.

* * * * *